(12) United States Patent
Miyata

(10) Patent No.: US 9,240,668 B2
(45) Date of Patent: Jan. 19, 2016

(54) METHOD FOR CONTROLLING WAVELENGTH TUNABLE LASER, AND WAVELENGTH TUNABLE LASER

(71) Applicant: Sumitomo Electric Device Innovations, Inc., Yokohama-shi (JP)

(72) Inventor: Mitsuyoshi Miyata, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 14/553,572

(22) Filed: Nov. 25, 2014

(65) Prior Publication Data

US 2015/0155679 A1 Jun. 4, 2015

(30) Foreign Application Priority Data

Nov. 29, 2013 (JP) .................... 2013-248620
Dec. 27, 2013 (JP) .................... 2013-271616

(51) Int. Cl.
*H01S 3/106* (2006.01)
*H01S 3/10* (2006.01)
*H01S 3/102* (2006.01)

(52) U.S. Cl.
CPC .............. *H01S 3/106* (2013.01); *H01S 3/1003* (2013.01); *H01S 3/10015* (2013.01); *H01S 3/1028* (2013.01); *H01S 3/1062* (2013.01)

(58) Field of Classification Search
CPC . H01S 3/1003; H01S 3/10015; H01S 3/1028; H01S 3/1062; H01S 5/026; H01S 3/106
See application file for complete search history.

(56) References Cited

FOREIGN PATENT DOCUMENTS

JP 2009-026996 2/2009

*Primary Examiner* — Armando Rodriguez
(74) *Attorney, Agent, or Firm* — Venable LLP; Michael A. Sartori; F. Brock Riggs

(57) ABSTRACT

A lasing wavelength is controlled so that a wavelength detection result becomes a first target value; selection is made to select either a step of calculating a second target value as a wavelength detection result with a shift of the lasing wavelength, or a step of calculating a third control value of a wavelength characteristic of an etalon for letting a laser lase at a wavelength with a shift of the lasing wavelength; in the former step, the lasing wavelength is controlled so that the wavelength detection result becomes the second target value; in the latter step, the lasing wavelength is controlled so that the wavelength detection result becomes the first target value.

13 Claims, 11 Drawing Sheets

Fig.3

| Ch | INITIAL SET VALUES | | | | | | | FEEDBACK CONTROL TARGET VALUES | |
|---|---|---|---|---|---|---|---|---|---|
| | $I_{LD}$ [mA] | $I_{SOA}$ [mA] | $T_{LD}$ [degC] | $T_{Etalon}$ [degC] | $P_{Heater1}$ [mW] | $P_{Heater2}$ [mW] | $P_{Heater3}$ [mW] | $I_{m1}$ [μA] | $I_{m2}/I_{m1}$ A.U. |
| 1 | 150.00 | 67.39 | 52.508 | 50.000 | 29.42 | 57.47 | 50.69 | 315.0 | 1.175 |
| 2 | 150.00 | 47.74 | 34.533 | 50.000 | 64.38 | 81.31 | 72.45 | 317.5 | 1.518 |
| 3 | 150.00 | 50.86 | 38.727 | 50.000 | 59.05 | 77.71 | 69.12 | 313.0 | 1.229 |
| ... | ... | ... | ... | ... | ... | ... | ... | ... | ... |
| n | 150.00 | 54.77 | 54.046 | 50.000 | 41.24 | 43.32 | 11.69 | 317.2 | 1.441 |

Fig.6

| TEMPERATURE CORRECTION COEFFICIENT | TEMPERATURE CORRECTION COEFFICIENT | TARGET CORRECTION COEFFICIENT |
|---|---|---|
| $C_1$ [GHz/°C] | $C_2$ [GHz/°C] | $B_1$ [GHz] |
| −1.800 | −1.800 | −32.000 |

(a)

(c)

(b)

| | FREQUENCY [THz] | TARGET VALUE |
|---|---|---|
| ITU GRID | 191.3000 | 0.547 |
| FTF-3GHz | 191.2970 | 0.657 |
| FTF+3GHz | 191.3030 | 0.468 |

(d)

| | FREQUENCY [THz] | TARGET VALUE |
|---|---|---|
| ITU GRID | 191.3000 | 0.657 |
| FTF-6GHz | 191.2940 | 0.657 |
| FTF+6GHz | 191.3060 | 0.468 |

US 9,240,668 B2

METHOD FOR CONTROLLING WAVELENGTH TUNABLE LASER, AND WAVELENGTH TUNABLE LASER

TECHNICAL FIELD

The present invention relates to a method for controlling a wavelength tunable laser, and a wavelength tunable laser.

BACKGROUND

A wavelength tunable laser allowing selection of an output wavelength is disclosed as a conventional wavelength tunable laser (e.g., cf. Patent Literature 1).

Patent Literature 1: Japanese Patent Application Laid-open Publication No. 2009-026996

SUMMARY

The technology of Patent Literature 1 is one to store control conditions for gaining the grid wavelengths defined by ITU-T (International Telecommunication Union, Telecommunication Standardization Sector) and to perform such control as to let the laser lase at any one of the grid wavelengths on the basis of the stored control conditions. Therefore, it is infeasible to perform control to let the laser lase at an arbitrary wavelength except for the grid wavelengths. For gaining an arbitrary wavelength, it is conceivable to change the temperature of an etalon provided in a wavelength locker. By changing the etalon temperature, the wavelength characteristic of the etalon can be varied, whereby the lasing wavelength by control operation of the wavelength locker can be shifted by the variation of the wavelength characteristic of the etalon. This makes it feasible to implement an operation to gain an arbitrary wavelength (which will be referred to herein as gridless control).

In some cases, the wavelength tunable laser is required not only to lase at a designated wavelength but also to further allow fine adjustment of the wavelength (which will be referred to herein as fine tuning).

An object of the present invention is, for example, to provide a method for controlling a wavelength tunable laser, and a wavelength tunable laser, while enabling realization of fine tuning with high degrees of freedom.

One aspect of the present invention is (1) a method for controlling a wavelength tunable laser having a wavelength detection unit including an etalon, the method comprising: a first step of acquiring information of a first control value to define a wavelength characteristic of the etalon in the drive condition corresponding to a first wavelength, a first target value of the wavelength detection unit corresponding to the first wavelength, a value of a second wavelength different from the first wavelength, and a value of a shift amount; a second step of calculating a second control value from the first control value to define a wavelength characteristic of the etalon to acquire the second wavelength when the wavelength detection unit detects the first target value; a third step of selecting either A) shifting wavelength of the laser by changing the first target value to a second target value corresponding to the shift amount, or B) shifting wavelength of the laser by changing the second control value of the wavelength characteristics of the etalon to a third control value of the wavelength characteristics of the etalon corresponding to the shift amount; and a fourth step of driving the laser by using either, A) second control value of the wavelength characteristics of the etalon, and the second target value, or B) third control value of the wavelength characteristics of the etalon, and the first target value.

According to the foregoing one aspect of the present invention, it is feasible, for example, to realize fine tuning with high degrees of freedom.

BRIEF DESCRIPTION OF THE DRAWINGS

FIG. 3 is a drawing showing initial set values and feedback control target values.

FIG. 6 is a drawing showing correction coefficients.

DETAILED DESCRIPTION

Figure 1:
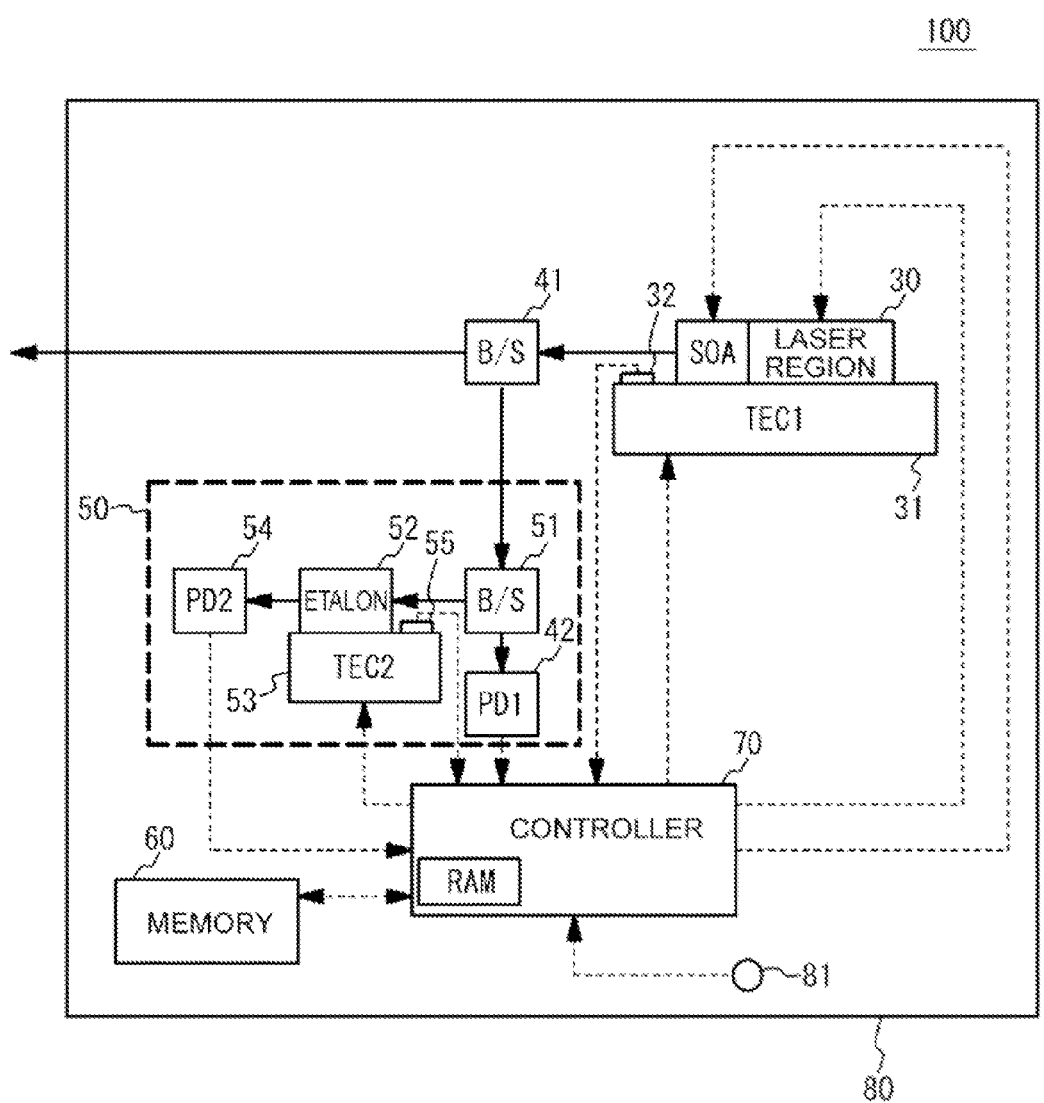
FIG. 1 is a block diagram showing an overall configuration of a wavelength tunable laser according to Example 1.

[Description of Embodiments of the Present Invention]
The contents of embodiments of the present invention will be first described as enumerated below.

One aspect of the present invention is (1) a method for controlling a wavelength tunable laser having a wavelength detection unit including an etalon, the method comprising: a first step of acquiring information of a first control value to define a wavelength characteristic of the etalon in the drive condition corresponding to a first wavelength, a first target value of the wavelength detection unit corresponding to the first wavelength, a value of a second wavelength different from the first wavelength, and a value of a shift amount; a second step of calculating a second control value from the first control value to define a wavelength characteristic of the etalon to acquire the second wavelength when the wavelength detection unit detects the first target value; a third step of selecting either A) shifting wavelength of the laser by changing the first target value to a second target value corresponding to the shift amount, or B) shifting wavelength of the laser by changing the second control value of the wavelength characteristics of the etalon to a third control value of the wavelength characteristics of the etalon corresponding to the shift amount; and a fourth step of driving the laser by using either, A) second control value of the wavelength characteristics of the etalon, and the second target value, or B) third control value of the wavelength characteristics of the etalon, and the first target value. (2) The method may comprise: a fifth step of controlling the wavelength of the wavelength tunable laser while the wavelength characteristic of the etalon is determined based on the second control value and the first target value is determined to be the control target value of the wavelength detection result obtained by the wavelength detection unit, prior to the third step. (3) Each of the control values of the wavelength characteristic of the etalon may be a temperature of the etalon, and the temperature of the etalon may be controlled by a temperature control device including a Peltier device. (4) The selecting in the third step may be carried out according to a sign of the shift amount acquired in the first step. (5) The third step may comprise selecting either one process with a smaller consumed power of the temperature control device. (6) The selecting in the third step may be carried out according to a relation between the temperature of the etalon and an ambient temperature around the etalon. (7) The first target value is generated to corresponding a plurality of target wavelengths, each target value being assigned alternately to the first range including a lower peak of the etalon and the second range including an upper peak of the etalon. (8) When receiving a demand for output of a wavelength different from the second wavelength, an operation to change the second target value is carried out according to a difference between the second wavelength and the required wavelength and the second target value is set in the variable range. (9) Each of the control values of the wavelength characteristic of the etalon is a temperature of the etalon, and the temperature of the etalon is controlled by a temperature control device including a Peltier device, and wherein when the second target value changes from the first range as the first target value toward the second range, or when the second target value changes from the second range as the first target value toward the first range, a consumed power of the temperature control device does not increase.

One aspect of the present invention is (10) a wavelength tunable laser comprising: an etalon having a wavelength characteristics that alternately changes an intensity of output value in accordance with continuously changing wavelength; a memory stores target values corresponding to a plurality of target wavelengths, each target value being assigned alternately to the first range including a lower peak of the etalon and the second range including an upper peak of the etalon; and a control unit for controlling a lasing wavelength by a feedback operation based on a difference between the target value and a wavelength detection result by a wavelength detection unit having the etalon, the control unit further controls changing wavelength in accordance with a shift amount by either, A) by changing the target value of the feedback operation, or B) by changing the wavelength characteristics of the etalon. (11) When receiving a demand for output of a wavelength different from the target wavelengths stored in the memory, the control unit may select the target wavelength, carry out an operation to change the target value depending upon a difference between the target wavelength and the required wavelength, and perform the feedback operation using the updated target value obtained by the operation. (12) The control unit may also carry out an operation to change a temperature of the etalon, as well as the operation to change the target value, and may perform the feedback operation depending upon the required wavelength with use of results of these operations. (13) When receiving a demand for output of a wavelength different from the target wavelengths stored in the memory, the control unit may select the target wavelength, carry out an operation to change a temperature of the etalon depending upon a difference between the target wavelength and the required wavelength, and perform the feedback operation at the etalon temperature obtained by the operation.

[Details of Embodiments of the Present Invention] Specific examples of the wavelength tunable laser according to the embodiment of the present invention will be described below with reference to the drawings. It should be noted that the present invention is by no means limited to these examples and is intended to embrace all changes within the meaning and extent equivalent to the scope of claims, as indicated by the scope of claims.

EXAMPLE 1

FIG. 1 is a block diagram showing an overall configuration of a wavelength tunable laser 100 according to Example 1. As shown in FIG. 1, the wavelength tunable laser 100 is equipped with a wavelength-controllable semiconductor laser 30 (tunable semiconductor laser) as a laser device. The semiconductor laser 30 of the present example is provided with a region to serve as SOA (Semiconductor Optical Amplifier), as coupled to a laser region. This SOA functions as a light output control unit. The SOA can optionally increase or decrease the intensity of light output. It is also possible to control the intensity of light output substantially to zero. The wavelength tunable laser 100 is further equipped with a detection unit 50, a memory 60, a controller 70, and so on. The detection unit 50 functions as an output detection unit and wavelength locker unit. The controller 70 is a unit to perform control of the wavelength tunable laser 100 and is internally provided with a RAM (Random Access Memory). Each of the parts of the wavelength tunable laser 100 is arranged in a housing 80.

Figure 2:
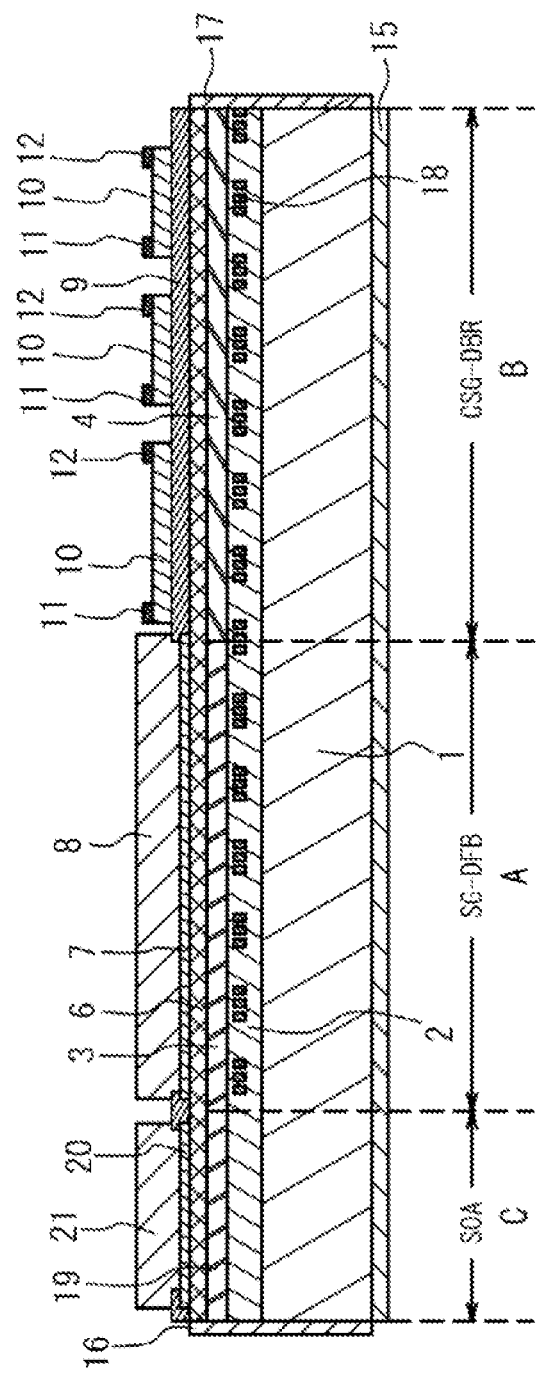
FIG. 2 is a schematic cross-sectional view showing an overall configuration of a semiconductor laser.

FIG. 2 is a schematic cross-sectional view showing an overall configuration of the semiconductor laser 30 in the present example. As shown in FIG. 2, the semiconductor laser 30 is provided with SG-DFB (Sampled Grating Distributed Feedback) region A, CSG-DBR (Chirped Sampled Grating Distributed Bragg Reflector) region B, and SOA (Semiconductor Optical Amplifier) region C. Namely, the semiconductor laser 30 is a laser having a wavelength selection mirror in the semiconductor structure.

As an example, the semiconductor laser 30 has the SOA region C, SG-DFB region A, and CSG-DBR region B arranged in this order from the front side to the rear side. The SG-DFB region A has a gain and is provided with sampled gratings. The CSG-DBR region B has no gain and is provided with sampled gratings. The SG-DFB region A and the CSG-DBR region B correspond to the laser region in FIG. 1 and the SOA region C corresponds to the SOA region in FIG. 1.

The SG-DFB region A has a structure in which a lower cladding layer 2, an active layer 3, an upper cladding layer 6, a contact layer 7, and an electrode 8 are stacked on a substrate 1. The CSG-DBR region B has a structure in which the lower cladding layer 2, an optical waveguide layer 4, the upper cladding layer 6, an insulating film 9, and a plurality of heaters 10 are stacked on the substrate 1. Each heater 10 is provided with a power electrode 11 and a ground electrode 12. The SOA region C has a structure in which the lower cladding layer 2, an optical amplification layer 19, the upper cladding layer 6, a contact layer 20, and an electrode 21 are stacked on the substrate 1.

In the SG-DFB region A, CSG-DBR region B, and SOA region C, each of the substrate 1, the lower cladding layer 2, and the upper cladding layer 6 is integrally formed. The active layer 3, the optical waveguide layer 4, and the optical amplification layer 19 are formed on the same surface. A boundary between the SG-DFB region A and the CSG-DBR region B corresponds to a boundary between the active layer 3 and the optical waveguide layer 4.

An end face film 16 is formed on end faces of the substrate 1, lower cladding layer 2, optical amplification layer 19, and upper cladding layer 6 on the SOA region C side. In the present example, the end face film 16 is an AR (Anti-Reflection) film. The end face film 16 functions as a front end face of the semiconductor laser 30. An end face film 17 is formed on end faces of the substrate 1, lower cladding layer 2, optical waveguide layer 4, and upper cladding layer 6 on the CSG-DBR region B side. In the present example, the end face film 17 is an AR film. The end face film 17 functions as a rear end face of the semiconductor laser 30.

The substrate 1 is, for example, a crystal substrate composed of n-type InP. The lower cladding layer 2 is n-type and the upper cladding layer 6 p-type, each of which is comprised, for example, of InP. The lower cladding layer 2 and the upper cladding layer 6 function to achieve optical confinement of the active layer 3, optical waveguide layer 4, and optical amplification layer 19 above and below them.

The active layer 3 is composed of a semiconductor having a gain. The active layer 3 has, for example, a quantum well structure and has, for example, a structure in which well layers of $Ga_{0.32}In_{0.68}As_{0.92}P_{0.08}$ (each having a thickness of 5 nm) and barrier layers of $Ga_{0.22}In_{0.78}As_{0.47}P_{0.53}$ (each having a thickness of 10 nm) are alternately stacked. The optical waveguide layer 4 can be comprised, for example, of a bulk semiconductor layer and can be comprised, for example, of $Ga_{0.22}In_{0.78}As_{0.47}P_{0.53}$. In the present example, the optical waveguide layer 4 has a larger energy gap than the active layer 3.

The optical amplification layer 19 is a region that is given a gain by current injection from the electrode 21, thereby to implement optical amplification. The optical amplification layer 19 can be composed, for example, of a quantum well structure and can be formed, for example, in a structure in which well layers of $Ga_{0.35}In_{0.65}As_{0.99}P_{0.01}$ (each having a thickness of 5 nm) and barrier layers of $Ga_{0.15}In_{0.85}As_{0.32}P_{0.68}$ (each having a thickness of 10 nm) are alternately stacked. As another structure, it is also possible to adopt a bulk semiconductor comprised, for example, of $Ga_{0.44}In_{0.56}As_{0.95}P_{0.05}$. It is also possible to make the optical amplification layer 19 and the active layer 3 of the same material.

The contact layers 7, 20 can be comprised, for example, of a p-type $Ga_{0.47}In_{0.53}As$ crystal. The insulating film 9 is a protective film composed of a silicon nitride film (SiN) or a silicon oxide film (SiO). The heaters 10 are thin-film resistors composed of titanium tungsten (TiW). Each of the heaters 10 may be formed across a plurality of segments of the CSG-DBR region B.

The electrodes 8, 21, power electrodes 11, and ground electrodes 12 are composed of an electroconductive material such as gold (Au). A back electrode 15 is formed on the bottom of the substrate 1. The back electrode 15 is formed across the SG-DFB region A, CSG-DBR region B, and SOA region C.

The end face film 16 and the end face film 17 are AR films having the reflectance of not more than 1.0% and thus have a property of substantially no reflection on the end faces. The AR films can be comprised, for example, of dielectric films of $MgF_2$ and TiON. The two ends of the laser in the present example are the AR films, but the end face film 17 is composed of a reflecting film having a significant reflectance in some cases. If the semiconductors in contact with the end face film 17 in FIG. 2 are provided with a structure having a light absorbing layer, the end face film 17 can be configured to have a significant reflectance, whereby light output can be prevented from leaking from the end face film 17 to the outside. The significant reflectance is, for example, a reflectance of not less than 10%. The reflectance herein refers to the reflectance with respect to the interior of the semiconductor laser.

Diffraction gratings (corrugations) 18 are formed at a plurality of locations with a predetermined space in the lower cladding layer 2 in the SG-DFB region A and the CSG-DBR region B. They form the sampled gratings in the SG-DFB region A and in the CSG-DBR region B. In the SG-DFB region A and the CSG-DBR region B, a plurality of segments are provided in the lower cladding layer 2. A segment herein refers to a region where a diffraction grating portion with the diffraction grating 18 and a space portion without the diffraction grating 18 are continuously set. Namely, a segment means a region in which a diffraction grating portion is coupled to a space portion located between diffraction grating portions at both ends. The diffraction gratings 18 are composed of a material with the refractive index different from that of the lower cladding layer 2. When the lower cladding layer 2 is InP, the material to be used for making up the diffraction gratings can be, for example, $Ga_{0.22}In_{0.78}As_{0.47}P_{0.53}$.

The diffraction gratings 18 can be formed by patterning using the two-beam interference exposure method. The space portions located between the diffraction gratings 18 can be substantialized by subjecting a resist to exposure with a pattern of the diffraction gratings and thereafter again implementing exposure at positions corresponding to the space portions. The pitch of the diffraction gratings 18 in the SG-DFB region A and the pitch of the diffraction gratings 18 in the CSG-DBR region B may be equal or different. In the present example, the two pitches are set equal as an example. In the respective segments, the diffraction gratings 18 may have the same length or may have different lengths. The diffraction gratings 18 may have the respective lengths such that the diffraction gratings 18 have the same length in the SG-DFB region A, the diffraction gratings 18 have the same length in the CSG-DBR region B, and the length of the diffraction gratings 18 in the SG-DFB region A is different from the length of the diffraction gratings 18 in the CSG-DBR region B.

In the SG-DFB region A, the optical lengths of the respective segments are substantially equal. In the CSG-DBR region B, the optical lengths of at least two segments are made different from each other. Because of this configuration, the intensities of peaks in the wavelength characteristic of the CSG-DBR region B come to have wavelength dependence. An average optical length of the segments in the SG-DFB region A is different from that of the segments in the CSG-DBR region B. In this way, the segments in the SG-DFB region A and the segments in the CSG-DBR region B constitute a resonator in the semiconductor laser 30.

Inside of each of the SG-DFB region A and the CSG-DBR region B, reflected light interferes with each other. The active layer 3 is provided in the SG-DFB region A and carrier injection thereinto results in generating a discrete gain spectrum with approximately aligned peak intensities and with a predetermined wavelength space. In the CSG-DBR region B, a discrete reflection spectrum is generated with different peak intensities and with a predetermined wavelength space. The space between peak wavelengths in the wavelength characteristic in the SG-DFB region A is different from that in the wavelength characteristic in the CSG-DBR region B. A wavelength satisfying a lasing condition can be selected by making use of the vernier effect caused by combination of these wavelength characteristics.

As shown in FIG. 1, the semiconductor laser 30 is disposed on a first temperature control device 31. The first temperature control device 31 includes a Peltier device and functions as TEC (Thermo-Electric Cooler). A first thermistor 32 is disposed on the first temperature control device 31. The first thermistor 32 detects the temperature of the first temperature control device 31. The temperature of the semiconductor laser 30 can be specified based on the temperature detected by the first thermistor 32.

In the wavelength tunable laser 100, the detection unit 50 is arranged on the front side of the semiconductor laser 30. Since the detection unit 50 functions as a wavelength locker unit, the wavelength tunable laser 100 can be called a front locker type. The detection unit 50 is equipped with a first light receiving element 42, a beam splitter 51, an etalon 52, a second temperature control device 53, a second light receiving element 54, and a second thermistor 55.

A beam splitter 41 is arranged at a position where the output light from the front side of the semiconductor laser 30 is to be split. The beam splitter 51 is arranged at a position where the light from the beam splitter 41 is to be split. The first light receiving element 42 is arranged at a position where it receives one of two light beams separated by the beam splitter 51. The etalon 52 is arranged at a position where it transmits the other of the two light beams separated by the beam splitter 51. The second light receiving element 54 is arranged at a position where it receives the transmitted light passing through the etalon 52.

The etalon 52 has such a characteristic that its transmittance periodically changes depending upon the wavelength of incident light. In the present example, the etalon 52 is a solid etalon. The periodical wavelength characteristic of the solid etalon varies with change in temperature. The etalon 52 is arranged at the position where it transmits the other of the two light beams separated by the beam splitter 51. The etalon 52 is disposed on the second temperature control device 53. The second temperature control device 53 includes a Peltier device and functions as TEC (Thermo-Electric Cooler).

The second light receiving element 54 is arranged at a position where it receives the transmitted light passing through the etalon 52. The second thermistor 55 is provided for specifying the temperature of the etalon 52. The second thermistor 55 is disposed, for example, on the second temperature control device 53. In the present example, the second thermistor 55 detects the temperature of the second temperature control device 53, thereby to specify the temperature of the etalon 52.

The memory 60 is a rewritable storage device. A typical example of the rewritable storage device is a flash memory. The controller 70 is equipped with a Central Processing Unit (CPU), a RAM (Random Access Memory), a power supply, and so on. The RAM is a memory for temporarily storing a program to be executed by the CPU, data to be processed by the CPU, and so on.

A temperature detection unit 81 is arranged on the housing 80. The temperature of the semiconductor laser 30 is controlled depending upon the lasing wavelength of the semiconductor laser 30. Therefore, the temperature of the housing 80 varies depending upon the lasing wavelength of the semiconductor laser 30. The temperature detection unit 81 detects the temperature of the housing 80 and sends the result to the controller 70. The temperature detection unit 81 may be built in the controller 70. The etalon 52 is affected by the temperature of the housing 80. For this reason, the temperature of the housing 80 can be regarded as ambient temperature around the etalon 52.

The memory 60 stores initial set values and feedback control target values of the respective parts of the wavelength tunable laser 100 in correspondence to channels. The channels are numbers corresponding to lasing wavelengths of the semiconductor laser 30. The wavelengths of the respective channels are discretely defined in a wavelength tunable band of the wavelength tunable laser 100. For example, the channels correspond to the respective grid wavelengths (at 50-GHz intervals) of ITU-T (International Telecommunication Union, Telecommunication Standardization Sector). Alternatively, the initial set values may be prepared at narrower intervals than the intervals of the ITU-T grids. In the present example, the wavelengths of the respective channels are defined as fundamental wavelengths.

FIG. 3 is a table showing the foregoing initial set values and feedback control target values. As shown in FIG. 3, the initial set values include initial current value $I_{LD}$ to be supplied to the electrode 8 of the SG-DFB region A, initial current value $I_{SOA}$ to be supplied to the electrode 21 of the SOA region C, initial temperature value $T_{LD}$ of the semiconductor laser 30, initial temperature value $T_{Etalon}$ of the etalon 52, and initial power values $P_{Heater1}$ to $P_{Heater3}$ to be supplied to the respective heaters 10. These initial set values are defined for each of the channels. The foregoing feedback control target values are target values in execution of feedback control of the controller 70. The feedback control target values include target value $I_{m1}$ of photocurrent output from the first light receiving element 42, and target value $I_{m2}/I_{m1}$ of ratio of photocurrent $I_{m2}$ output from the second light receiving element 54 to photocurrent $I_{m1}$ output from the first light receiving element 42. The control target values are also defined for each of the channels. These values are acquired from each individual laser by tuning with a wavemeter, before shipping of the wavelength tunable laser 100.

Figure 4:
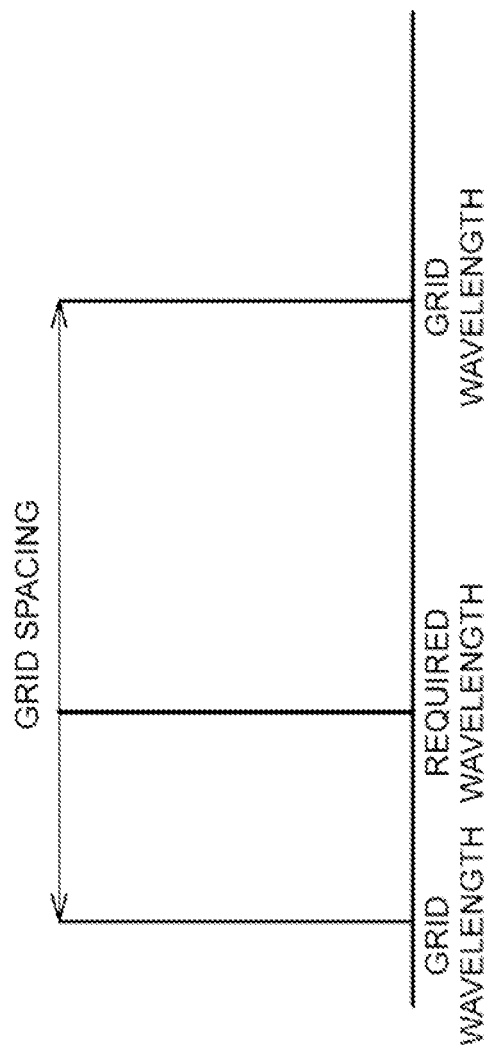
FIG. 4 is a drawing showing a relationship between a required wavelength and fundamental wavelengths in gridless control.

The wavelength tunable laser 100 according to the present example can output a required wavelength even if the required wavelength is not coincident with any one of the fundamental wavelengths. The control to enable output at a wavelength different from the fundamental wavelengths will be referred to hereinafter as gridless control. FIG. 4 is a drawing showing the relationship between a required wavelength and fundamental wavelengths in the gridless control. In the gridless control, as shown in FIG. 4, the required wavelength is a wavelength between a fundamental wavelength and another fundamental wavelength adjacent thereto. It is noted that the required wavelength may be coincident with one of the fundamental wavelengths.

Figure 5:
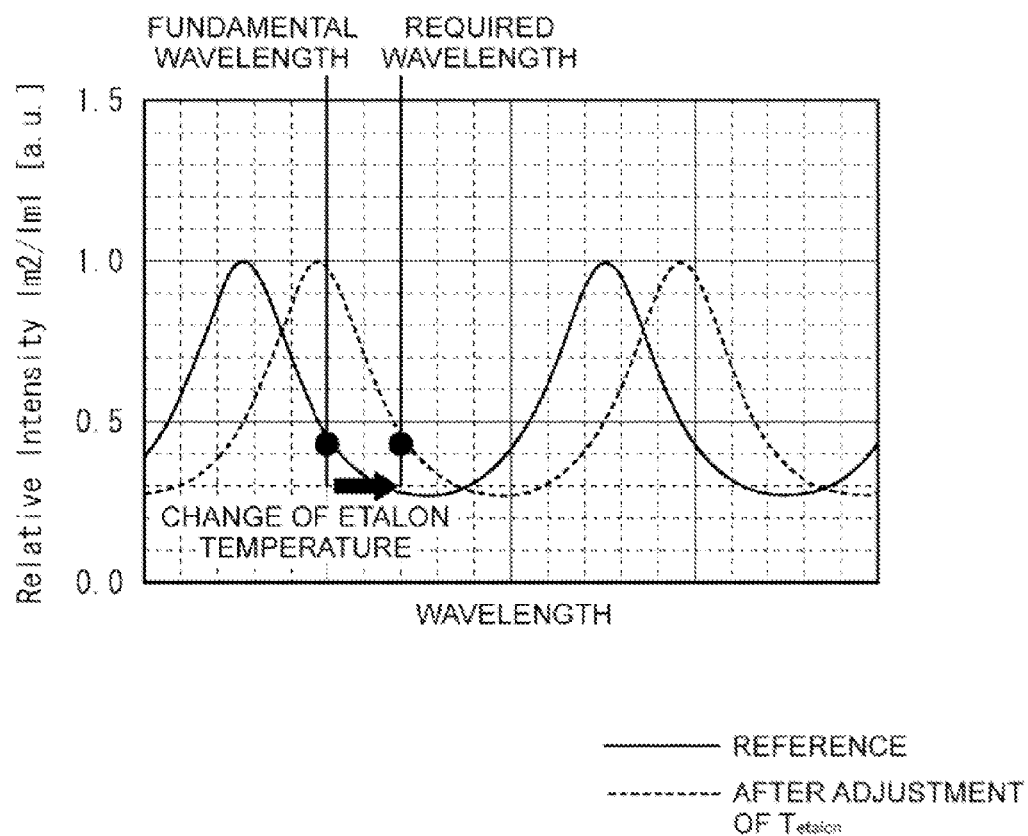
FIG. 5 is a drawing showing the principle of the gridless control.

FIG. 5 is a drawing showing the principle of the gridless control. In FIG. 5, the horizontal axis represents wavelengths and the vertical axis normalized values of ratio $I_{m2}/I_{m1}$ (transmittances of the etalon 52). In FIG. 5, a solid curve indicates a wavelength characteristic corresponding to the initial set value $T_{Etalon}$ of the etalon 52. Furthermore, a dotted curve indicates a wavelength characteristic in a case where the temperature of the etalon 52 is increased by the second temperature control device 53. Supposing the ratio $I_{m2}/I_{m1}$ at a solid dot on the solid curve is adopted as a feedback target value and if the etalon 52 is at the initial temperature value $T_{Etalon}$, the laser will lase at the fundamental wavelength. On the other hand, if the etalon 52 is at a temperature corresponding to the wavelength characteristic indicated by the dotted curve, even if the ratio $I_{m2}/I_{m1}$ is equal to the value to gain the fundamental wavelength (a solid dot on the dotted curve), the actual lasing wavelength will shift from the fundamental wavelength by a degree of change of the etalon characteristic. This means that the required wavelength can be realized by shifting the etalon characteristic by the wavelength difference between the required wavelength and the fundamental wavelength, without any change in the ratio $I_{m2}/I_{m1}$ of the feedback target value. Namely, an operation to change the etalon temperature is carried out based on the wavelength difference ΔF between the required wavelength and the fundamental wavelength and the resulting temperature obtained by this operation is applied as a new etalon temperature, thereby enabling realization of the required wavelength.

As described above, the wavelength characteristic of the etalon 52 shifts in accordance with the temperature thereof. Frequency variation/temperature change [GHz/° C.] in the etalon 52 is referred to as temperature correction coefficient C1 of the etalon 52. It is noted that wavelength is expressed by frequency herein. The temperature correction coefficient C1 is equivalent to a change rate of wavelength change to drive condition of the wavelength tunable laser. The temperature correction coefficient C1 is stored in the memory 60. FIG. 6 is an example of the temperature correction coefficient C1 stored in the memory 60. In the present example, the temperature correction coefficient C1 is a value common to all the channels in FIG. 3.

Let us define Tetln_A [° C.] as a set temperature of the etalon 52 for realizing the required wavelength in the gridless control. Furthermore, let us define Tetln_B [° C.] as an initial temperature of the etalon 52, or a temperature of the etalon 52 corresponding to the fundamental wavelength selected. Tetln_B is equivalent to $T_{Etalon}$ and is acquired from the memory 60. Furthermore, let us define ΔF1 [GHz] as a wavelength difference (absolute value) between the fundamental wavelength and the required wavelength in the gridless control. In this case, the relationship of the parameters can be expressed by Expression (1) below. We can determine the set temperature Tetln_A necessary for gaining the required wavelength in the gridless control, based on Expression (1).

$$Tetln\_A = Tetln\_B + \Delta F1/C1 \qquad (1)$$

By controlling the temperature of the second temperature control device 53 to the set temperature Tetln_A, the required wavelength in the gridless control can be gained while making use of the ratio $I_{m2}/I_1$ as it is.

By executing the above operation, the semiconductor laser 30 can lase at the wavelength (required wavelength) shifting from the fundamental wavelength by the shift of the characteristic of the etalon 52, as shown in FIG. 5. The required wavelength in the gridless control described above is a wavelength except for the wavelengths (fundamental wavelengths) gained by lasing under the conditions stored in the memory 60. In order to achieve the lasing at the required wavelength in the gridless control, however, it is necessary to execute the lasing operation from a standstill condition, as in the case of the fundamental wavelength being output.

On the other hand, the wavelength tunable laser is equipped with a function to allow fine adjustment (fine tuning) of an output wavelength at which the laser has lased once, regardless of whether the output wavelength is the fundamental wavelength or the required wavelength, as performance of the wavelength tunable laser. For example, when this fine tuning is adopted, a user is allowed to optimize the wavelength in each communication line. Therefore, this fine tuning requires an operation to change the lasing wavelength while the wavelength tunable laser 100 maintains the lasing state.

Figure 7:
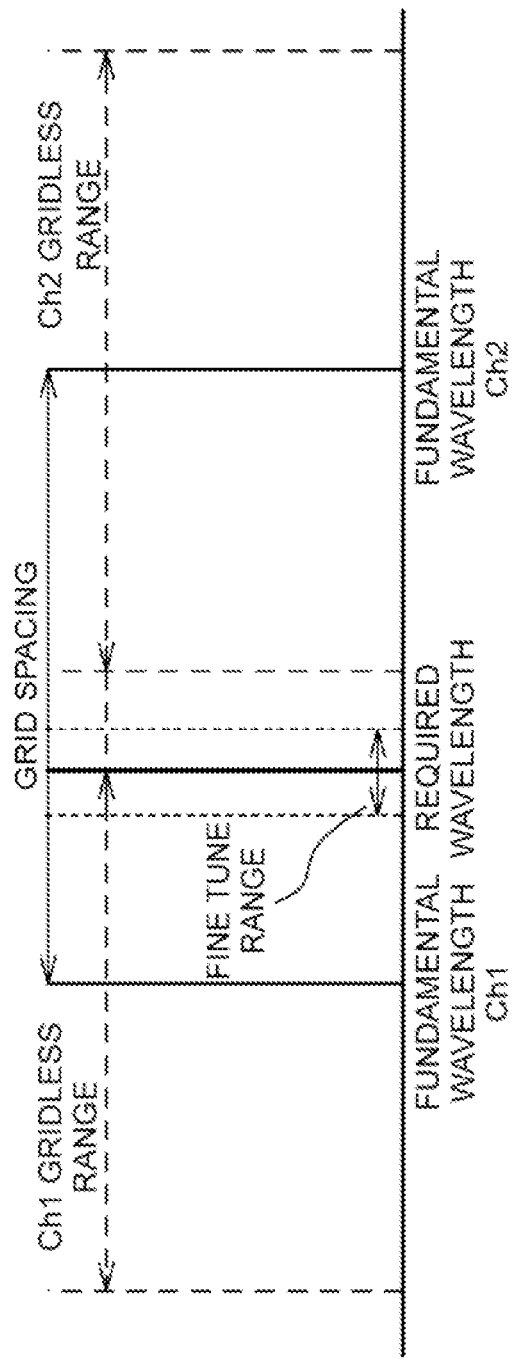
FIG. 7 is a drawing showing a fine tune range.

A fine tune range will be summarized below. FIG. 7 is a drawing showing the fine tune range. As shown in FIG. 7, for example, the gridless range at the fundamental wavelength Ch1 is defined as a Ch1 gridless range, and the gridless range at the fundamental wavelength Ch2 as a Ch2 gridless range. A boundary between the Ch1 gridless range and the Ch2 gridless range is an intermediate wavelength between the fundamental wavelength Ch1 and the fundamental wavelength Ch2. In implementing the fine tuning to realize the required wavelength, an approximate formula for Ch1 is used in the Ch1 gridless range and an approximate formula for Ch2 in the Ch2 gridless range.

For realizing the fine tuning, it is necessary to input a parameter for the fine tuning into the wavelength tunable laser, in addition to a parameter indicative of the lasing wavelength. Typical input parameters into the wavelength tunable laser are represented, for example, by a designated lasing wavelength (fundamental wavelength or required wavelength) and a fine tuning value, as in Table 1 below. The fine tuning value is represented by a difference wavelength (ΔF2 [GHz]) from the designated lasing wavelength.

TABLE 1

| Lasing wavelength | Fine tuning value (ΔF2) |
|---|---|
| 191.3000 THz | ±1.000 GHz |

This fine tuning value is changeable even during the lasing operation of the wavelength tunable laser 100 and in accordance with the change, the wavelength tunable laser 100 needs to allow change of the lasing wavelength.

Figure 8:
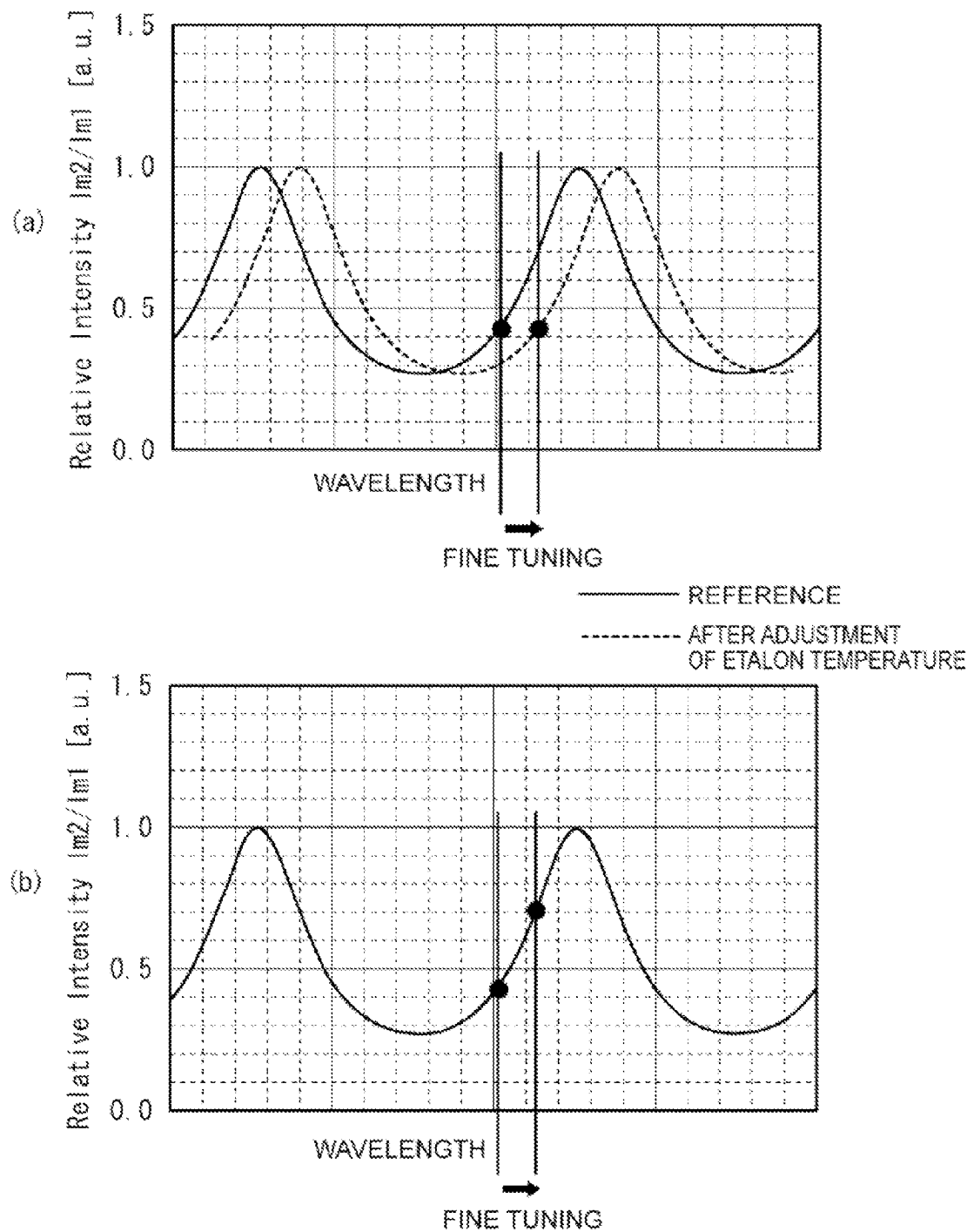
FIG. 8 includes (a) a drawing showing fine tuning making use of temperature change of an etalon, and (b) a drawing showing change in feedback control target value.

For finely adjusting the wavelength by the fine tuning, it is also conceivable to change the wavelength by changing the temperature of the etalon 52. Part (a) of FIG. 8 is a drawing showing the fine tuning in this case. A set temperature of the etalon 52 for realizing the required wavelength in the fine tuning is denoted by Tetln_C [° C.]. The set temperature of the etalon 52 for realizing the required wavelength in the gridless control is denoted by Tetln_A [° C.], as described above. The wavelength difference (absolute value) between the required wavelength in the gridless control and the required wavelength in the fine tuning is denoted by ΔF2 [GHz]. In this case, the relation of the parameters can be expressed as in Expression (2) below. The set temperature Tetln_C necessary for gaining the required wavelength in the fine tuning can be determined based on Expression (2).

$$Tetln\_C = Tetln\_A + \Delta F2/C2 \qquad (2)$$

By controlling the temperature of the second temperature control device 53 to the set temperature Tetln_C, it becomes feasible to gain the required wavelength in the fine tuning, while making use of the ratio $I_{m2}/I_{m1}$ as it is. The temperature correction coefficient C2, as shown in FIG. 6, is stored in the memory 60. The temperature correction coefficient C2 may be the same value as the temperature correction coefficient C1, or may be set to a value different from the temperature correction coefficient C1, for the fine tuning.

Alternatively, it is conceivable to change an optical transmittance target of AFC control, while keeping the temperature of the etalon 52 unchanged (or holding the temperature at a constant value) in the fine tuning. This means that the ratio $I_{m2}/I_{m1}$ of the feedback control target value is changed. Part (b) of FIG. 8 is a drawing showing a change of the ratio $I_{m2}/I_{m1}$ of the feedback control target value.

By acquiring the relation between wavelength and transmittance of the etalon 52, we can determine a change amount of the ratio $I_{m2}/I_{m1}$ with respect to a wavelength change amount in the fine tuning. For example, the relation between wavelength and transmittance of the etalon 52 can be approximated by Expression (3) below. In Expression (3) below, Target_A [A.U.] is the ratio $I_{m2}/I_{m1}$ at the required wavelength in the fine tuning and Target_B [A.U.] the ratio $I_{m2}/I_{m1}$ at the required wavelength in the gridless control. The target correction coefficient B1, as shown in FIG. 6, is stored in the memory 60. Although Expression (3) below is an approximation by a linear expression, the relation may be approximated by a high order expression.

$$Target\_A = Target\_B + \Delta F2/B1 \qquad (3)$$

As described above, the fine tuning can be implemented either by the method of changing the temperature of the etalon 52 or by the method of changing the ratio $I_{m2}/I_{m1}$ of the feedback control target value. In the present example, the controller 70 selects and executes either of these methods when performing the fine tuning. This makes it feasible to realize the fine tuning with high degrees of freedom.

The following will describe examples of criteria for determination in selecting the fine tuning realization method. As an example, the fine tuning method may be selected depending upon the sign of the frequency change in the fine tuning. In the present example, when the temperature of the etalon 52 is lowered with the ratio $I_{m2}/I_{m1}$ of the feedback control target value being kept constant, the lasing frequency of the semiconductor laser 30 increases in the AFC control. For example, in a situation where the semiconductor laser 30 operates at a high temperature (e.g., 80° C.) and where the etalon 52 is cooled by the second temperature control device 53 in order to avoid influence of the high temperature, if the temperature of the etalon 52 is decreased (e.g., from 40° C. to 30° C.) to increase the lasing frequency of the semiconductor laser 30, the consumed power of the second temperature control device 53 will increase. Then, the method of changing the ratio $I_{m2}/I_{m1}$ of the feedback control target value is adopted for increasing the lasing frequency in the fine tuning. In this case, it is possible to avoid the increase in the consumed power of the second temperature control device 53. On the other hand, the method of changing the temperature of the etalon 52 is adopted for decreasing the lasing frequency in the fine tuning. In this case, if the temperature of the etalon 52 is attempted to increase in order to decrease the lasing frequency, the consumed power of the second temperature control device 53 will decrease. By adopting such criteria, it is feasible to reduce the consumed power.

Next, the fine tuning method may be selected depending upon the relation between the temperature detected by the temperature detection unit 81 and the temperature of the etalon 52. Namely, the fine tuning method may be selected depending upon the relation between the temperature of the etalon 52 and the ambient temperature around the etalon 52. For example, the temperature of the etalon 52 is estimated in the case of tuning to a maximum in the fine tune range in the same sign as the sign of the frequency change in the fine tuning (the estimated temperature will be referred to hereinafter as FTF temperature). In this case, the method of changing the temperature of the etalon 52 is adopted if with change in the temperature of the etalon 52 to the FTF temperature the temperature of the etalon 52 becomes closer to the detected temperature by the temperature detection unit 81. In this case, it is feasible to reduce the consumed power of the second temperature control device 53. On the other hand, the method of changing the ratio $I_{m2}/I_{m1}$ of the feedback control target value is adopted if with change in the temperature of the etalon 52 to the FTF temperature the temperature of the etalon 52 becomes farther from the detected temperature by the temperature detection unit 81. In this case, it is feasible to avoid the increase in the consumed power of the second temperature control device 53.

It should be noted herein that examples of criteria for determination in selecting the fine tuning realization method are not limited to the above-described examples.

Figure 9:
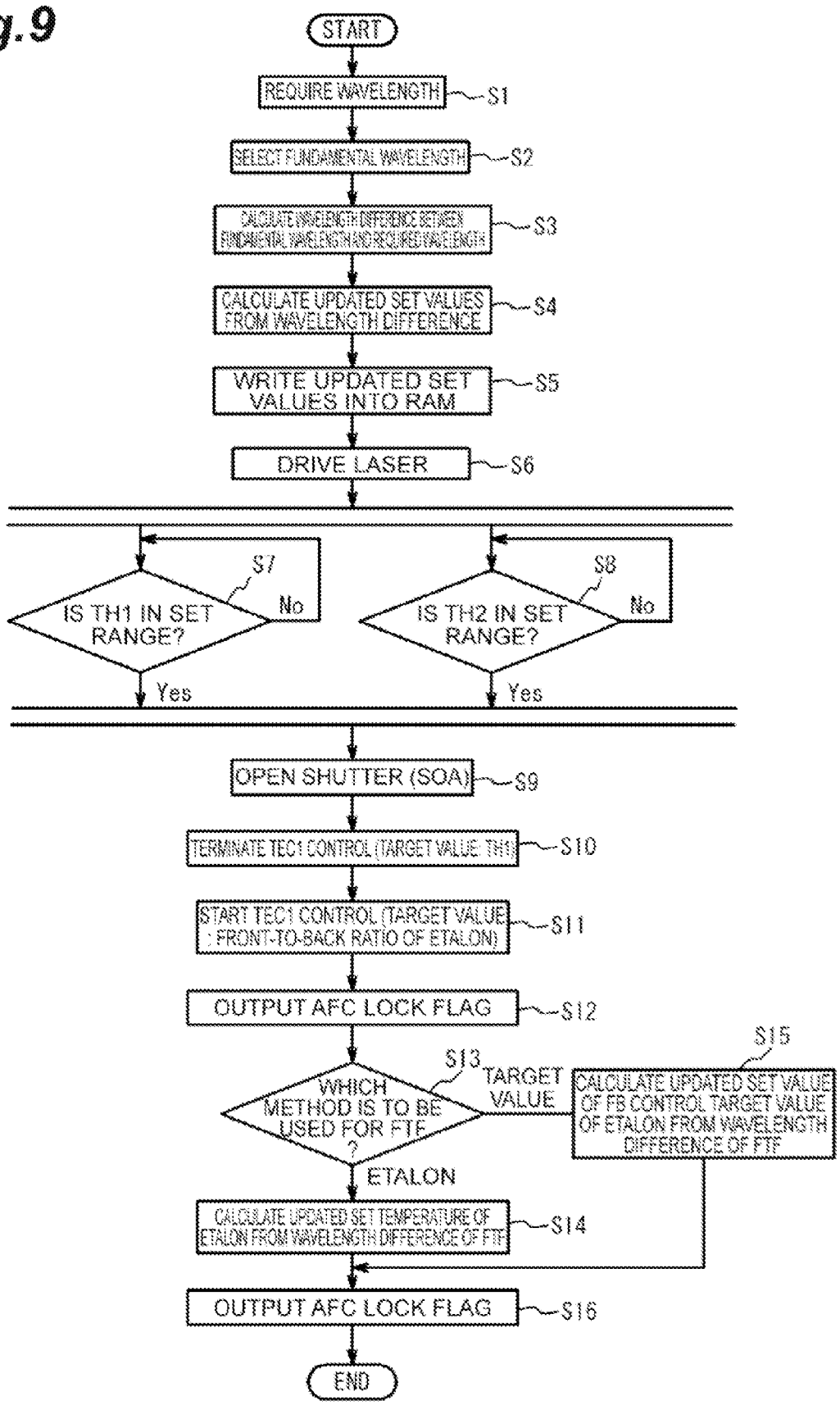
FIG. 9 is an example of flowchart.

FIG. 9 is an example of flowchart in carrying out the fine tuning. As shown in FIG. 9, the controller 70 receives a requirement for a wavelength (step S1). This required wavelength is one in the gridless control and an input from an unillustrated external input/output device. As an example, let us assume that 196.1070 [THz] is designated as the required wavelength. Typically, an input/output device to be adopted is one compliant with the RS232C standard. The input information from the external input/output device may include required wavelength information in the fine tuning.

The required wavelength in the gridless control is accepted over the whole of the wavelength band between the fundamental wavelengths stored in the memory 60. Namely, even if the input required wavelength is not any one of the fundamental wavelengths, the input is not rejected. Furthermore, the wavelength tunable laser 100 is configured so as to be able to control the wavelength, over the entire wavelength band of a range from a point where the input required wavelength coincides with a fundamental wavelength to a point where the input required wavelength coincides with an adjacent fundamental wavelength at most. For implementing it, the shift width of the wavelength characteristic of the etalon 52 needs only to be variable over the range of the difference between adjacent fundamental wavelengths. The memory 60 stores the wavelength of a maximum or a minimum (start grid), out of the fundamental wavelengths in FIG. 3, and the wavelength difference between the fundamental wavelengths (grid wavelength spacing).

Next, the controller 70 selects a fundamental wavelength, depending upon the required wavelength, and retrieves the initial set value and feedback control target value for the fundamental wavelength from the memory 60 (step S2). For example, the controller 70 obtains a difference between the required wavelength and the start grid wavelength and adopts an integral part obtained by dividing the difference by the grid wavelength spacing, as a channel number Ch. The controller 70 selects the fundamental wavelength corresponding to the resulting channel number Ch. For example, the fundamental wavelength is obtained by adding a value resulting from multiplication of the value obtained as the channel number Ch, by the grid wavelength spacing, to the start grid wavelength. As an example, the selected fundamental wavelength is assumed to be 196.1000 [THz]. The fundamental wavelength is set as shifted to the lower-frequency side from a center of the target variable region.

Next, the controller 70 calculates the wavelength difference ΔF1 between the fundamental wavelength and the required wavelength in the gridless control (step S3). In the above example, ΔF1=+7.0 [GHz]. Next, the controller 70 calculates updated set values, based on the wavelength difference ΔF1 (step S4). When it is assumed that the etalon temperature Tetln_B stored as the initial set value is 36.000 [° C.] and the temperature correction coefficient C1 is −1.800 [GHz/° C.], Tetln_A is calculated to be 32.111 [° C.]. Furthermore, the controller 70 calculates drive conditions of the semiconductor laser 30 at the required wavelength in the gridless control. For example, the controller 70 refers to unillustrated correction coefficients from the memory 60 to calculate updated set values from the initial current value $I_{LD}$, initial temperature value $T_{LD}$, and initial power values $P_{Heater1}$ to $P_{Heater3}$ and from the wavelength difference ΔF1.

Then the controller 70 writes the updated set values into the RAM of its own (step S5). Next, the controller 70 drives the semiconductor laser 30 with use of the updated set values written in the RAM (step S6). The SOA region C is controlled not to output light from the semiconductor laser 30 at this point of time. Next, the controller 70 determines whether the detected temperature TH1 by the first thermistor 32 is in a range of $T_{LD}$ (step S7). The range of $T_{LD}$ herein refers to a predetermined range centered at the temperature value $T_{LD}$ of the updated set value. When step S7 results in determining "No," the controller 70 changes the current value supplied to the first temperature control device 31 so as to make the detected temperature TH1 by the first thermistor 32 closer to the temperature value $T_{LD}$.

In parallel with step S7, the controller 70 determines whether the detected temperature TH2 by the second thermistor 55 is in a set range (step S8). The set range in this case is determined based on the set temperature Tetln_A included in the updated set values. For example, the foregoing set range can be a predetermined range centered at the set temperature Tetln_A. When step S8 results in determining "No," the controller 70 changes the current value supplied to the second temperature control device 53 so as to make the detected temperature TH2 by the second thermistor 55 closer to the set temperature Tetln_A.

The controller 70 waits until "Yes" is determined in both of step S7 and step S8. When "Yes" is determined in both of step S7 and step S8, the controller 70 performs a shutter opening operation (step S9). Specifically, it controls the current supplied to the electrode 21 of the SOA region C to the initial current value $I_{SOA}$. This control results in outputting laser light of the updated wavelength based on the updated set values from the semiconductor laser 30.

Next, the controller 70 terminates the temperature control with the control target being the temperature value $T_{LD}$ by the first temperature control device 31 (step S10). Next, the controller 70 starts the AFC control by the first temperature control device 31 (step S11). Specifically, the temperature of the first temperature control device 31 is subjected to feedback control so as to satisfy the ratio $I_{m2}/I_{m1}$ of the feedback control target value. A ratio of input light and output light of the etalon 52 (front-to-back ratio) represents the lasing wavelength of the semiconductor laser 30. Furthermore, the first temperature control device 31 is a parameter to control the wavelength of the semiconductor laser 30. Namely, step S11 is to control the wavelength of the semiconductor laser 30 by the feedback control of the temperature of the first temperature control device 31 so as to make the front-to-back ratio equal to $I_{m2}/I_{m1}$. This control realizes the required wavelength.

When the controller 70 confirms that the ratio $I_{m2}/I_{m1}$ is in a predetermined range centered at the target value $I_{m2}/I_{m1}$ at the fundamental wavelength selected in step S2, it outputs an AFC lock flag (step S12). Thereafter, when receiving the required wavelength in the fine tuning, the controller 70 selects the fine tuning method depending upon the required wavelength in the fine tuning (step S13). In step S13, the fine tuning method is selected according to the aforementioned criteria for determination.

When step S13 results in selecting the method of changing the temperature of the etalon 52, the controller 70 changes the temperature of the etalon 52 in accordance with the aforementioned Expression (2) so as to realize the required wavelength in the fine tuning (step S14). For example, when it is assumed that ΔF2=+10 GHz, the temperature correction coefficient C2 is −1.800 [GHz/° C.], and the set temperature Tetln_A is 32.111 [° C.], the set temperature Tetln_C is calculated to be 31.555 [° C.].

When step S13 results in selecting the method of changing the ratio $I_{m2}/I_{m1}$ of the feedback control target value, the controller 70 changes the feedback control target value in accordance with the aforementioned Expression (3) so as to realize the required wavelength in the fine tuning (step S15). For example, when it is assumed that ΔF2=+1 GHz, the correction coefficient B1 is −32 [GHz], and Target_B=0.55, Target_A is calculated to be 0.52.

When the controller 70 confirms that the execution of step S14 or step S15 results in changing the lasing wavelength of the semiconductor laser 30 and the resulting wavelength coincides with the required wavelength in the fine tuning or falls within a range with a predetermined width for the value of the required wavelength, it again outputs the AFC lock flag (step S16). Thereafter, execution of the flowchart is terminated.

In the present example, the fine tuning can be executed by selecting either of the method of changing the temperature of the etalon 52 and the method of changing the ratio $I_{m2}/I_{m1}$ of the feedback control target value. This makes it feasible to realize the fine tuning with high degrees of freedom. Furthermore, the criteria for determination can be simplified by determining the way of selecting the method depending upon the sign of the wavelength difference ΔF2.

By adopting the method of changing the ratio $I_{m2}/I_{m1}$ of the feedback control target value in increasing the lasing frequency of the semiconductor laser 30 in the fine tuning, it is feasible to avoid the increase in the consumed power of the second temperature control device 53. On the other hand, by adopting the method of changing the temperature of the etalon 52 in decreasing the lasing frequency, it is feasible to decrease the consumed power of the second temperature control device 53.

By adopting the method of changing the temperature of the etalon 52 in making the temperature of the etalon 52 closer to the ambient temperature in the fine tuning, it is feasible to decrease the consumed power of the second temperature control device 53. By adopting the method of changing the ratio $I_{m2}/I_{m1}$ of the feedback control target value in the case necessitating to make the temperature of the etalon 52 farther from the ambient temperature, it is feasible to avoid the increase in the consumed power of the second temperature control device 53.

MODIFICATION OF EXAMPLE 1

The ratio $I_{m2}/I_{m1}$ of the feedback control target value can be expressed as P2/P1 where P1 is the intensity of light received by the first light receiving element 42 and P2 the intensity of light received by the second light receiving element 54. Typically, these light intensities are converted into electric currents in the first light receiving element 42 and in the second light receiving element 54 and the electric currents are made to flow through respective resistors for detection to detect voltages generated therein, as the light intensities. When R1 represents a detected resistance to the output current from the first light receiving element 42 and R2 a detected resistance to the output current from the second light receiving element 54, the relation of Expression (4) below is obtained. $I_{m2} \times R2$ can also be expressed by V2 and $I_{m1} \times R1$ by V1.

$$P2/P1 = (I_{m2} \times R2)/(I_{m1} \times R1) \qquad (4)$$

In the AFC control using the etalon 52, a frequency change is converted into a change of the light intensity P2 after transmission through the etalon 52, to be used in the control. It is, however, often the case that V2, the voltage resulting from conversion of the current $I_{m2}$ by resistor, is practically used in the control circuit. The resistance R2 is normally a fixed value, but it is also possible to change the resistance R2 so as to keep the voltage V2 constant while cancelling the change of the current $I_{m2}$, and thereby realizing a desired frequency with the target value P2/P1 (=V2/V1) being kept constant. In the method of changing the ratio $I_{m2}/I_{m1}$ of the feedback control target value, the target value is changed along the transmittance curve of the etalon 52, whereas, for changing the resistance, it is necessary to achieve a resistance change equivalent to the inverse of the transmittance curve. The formula necessary for the resistance change is simpler than the transmittance curve and, if a variable resistor which is variable with necessary accuracy is used, the method of resistance change is a useful method.

The above modification used the detection result by the temperature detection unit 81 as the ambient temperature around the etalon 52, but the ambient temperature to be employed does not have to be limited only to it. For example, the detection result by the first thermistor 32 may be used instead as the ambient temperature of the etalon 52.

The above modification adopted the solid etalon as the etalon 52, but it is also possible to use an etalon except for it. For example, a liquid crystal etalon wherein a liquid crystal layer is interposed between mirrors may be used as the etalon 52. In this case, the wavelength characteristic of the liquid crystal etalon can be shifted by controlling a voltage applied to the liquid crystal. Furthermore, an air gap etalon wherein a gap length between mirrors can be changed depending upon an applied voltage may also be used as the etalon 52. In this case, the wavelength characteristic of the air gap etalon can be shifted by controlling the applied voltage. In either case of these liquid crystal etalon and air gap etalon, the temperature is controlled by the second temperature control device 53. However, the temperature control in this case is not for shifting the wavelength characteristic but for preventing variation in the wavelength characteristic due to temperature. For this reason, the temperature is controlled to be constant.

In the above modification, the fundamental wavelength can be referred to as first wavelength, the required wavelength in the gridless control as second wavelength, Target_B as first target value, Target_A as second target value, Tetln_B as first control value of the etalon 52, Tetln_A as second control value of the etalon 52, and Tetln_C as third control value of the etalon 52.

The above detailed Example 1 of the present invention but it should be noted that the present invention is not limited to such specific Example 1 and can be modified or changed in various ways within the scope of the essence of the present invention as described in the scope of claims.

EXAMPLE 2

In the aforementioned Example 1, the fine tuning can be implemented by using the method of changing the temperature of the etalon 52 (which will also be referred to hereinafter as etalon temperature changing method) and the method of changing the ratio $I_{m2}/I_{m1}$ of the feedback control target value (target changing method).

When the target changing method described with Part (b) of FIG. 8 is adopted, the temperature of the etalon 52 is kept unchanged and thus there is no need for control of temperature value of the second temperature control device 53. In the target changing method, however, the frequency is allowed to be continuously changed only in a limited variable range between a peak and a bottom of the light transmission characteristic. Namely, when only the target changing method is used, there is a possibility of failing to obtain a sufficient fine tune range. Therefore, the present Example 2 uses both of the etalon temperature changing method and the target changing method to expand the fine tune range.

Figure 10:
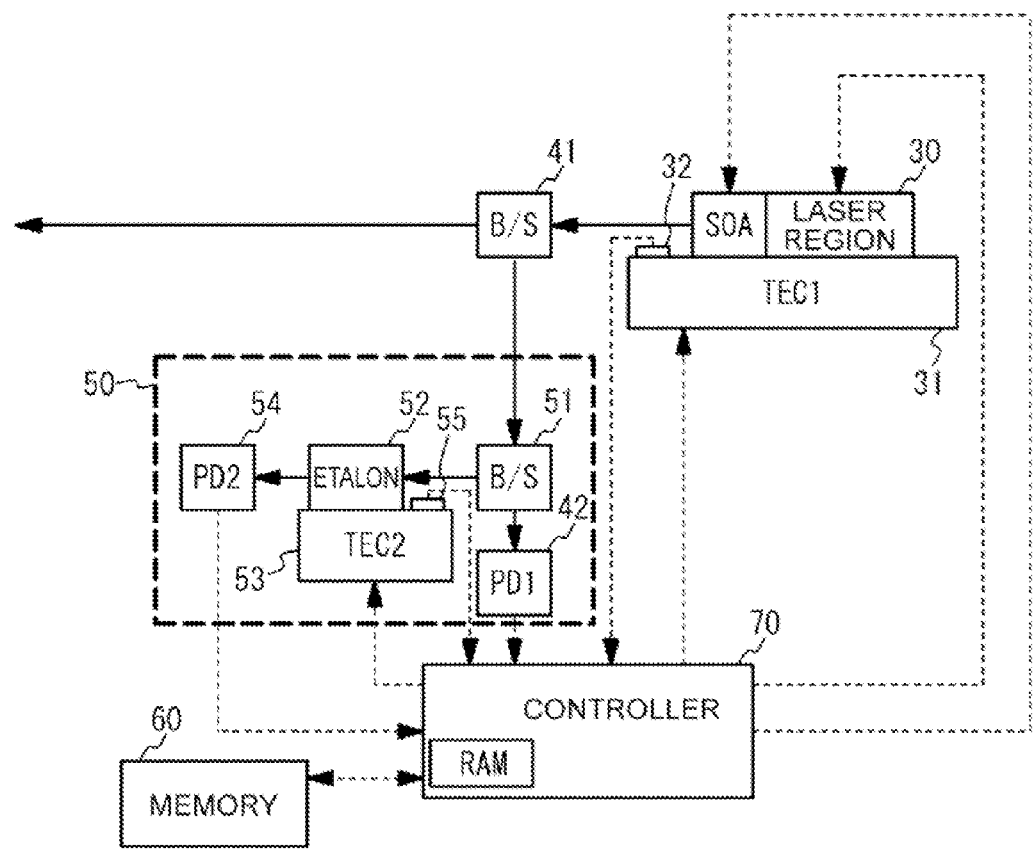
FIG. 10 is a block diagram showing an overall configuration of a wavelength tunable laser according to Example 2.

Specifically, the etalon temperature changing method is adopted if the sign of a wavelength shift amount from the wavelength at a start of the fine tune is one of the positive and negative signs and the target changing method is adopted when the sign is the other. This can expand the fine tune range. A wavelength tunable laser 100a in the present Example 2 is shown in FIG. 10. The wavelength tunable laser 100a is one obtained by excluding the temperature detection unit 81 from the configuration of the wavelength tunable laser 100 in Example 1.

For expanding the fine tune range in the target changing method, it is preferable to shift the position of the wavelength at the fine tune start to either one side from the center of the target variable range, thereby expanding the target variable range on one side. Since the target variable range becomes narrower on the other side, the etalon temperature changing method is used in this direction. For example, an available way is such that the position of the fundamental wavelength of each channel is set on either one side from the center of the target variable range and the etalon temperature changing method is adopted in the gridless control. Another available way is such that in the gridless control the updated set values of the temperature of the etalon 52 and the ratio $I_{m2}/I_{m1}$ of the feedback control target value are calculated so as to locate the position of the required wavelength on either one side from the center of the target variable range. When the wavelength at the fine tuning start is shifted to an end of the target variable range, the foregoing one-side fine tune range can be expanded to double.

Figure 11:
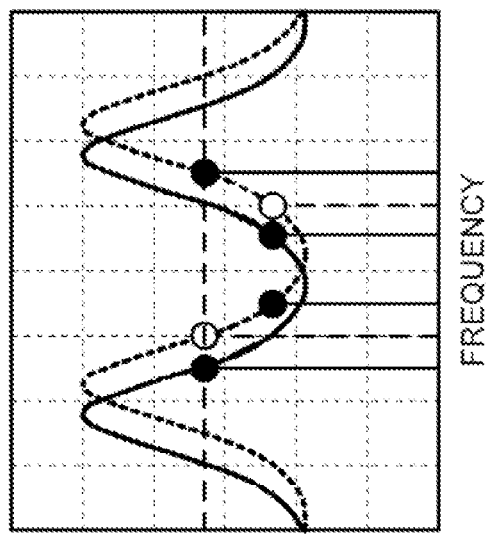
FIG. 11 includes drawings ((a) and (b)) showing the fine tune range in a case adopting only a target changing method, and drawings ((c) and (d)) showing the fine tune range in a case adopting both of the target changing method and the etalon temperature changing method.
Figure 11:
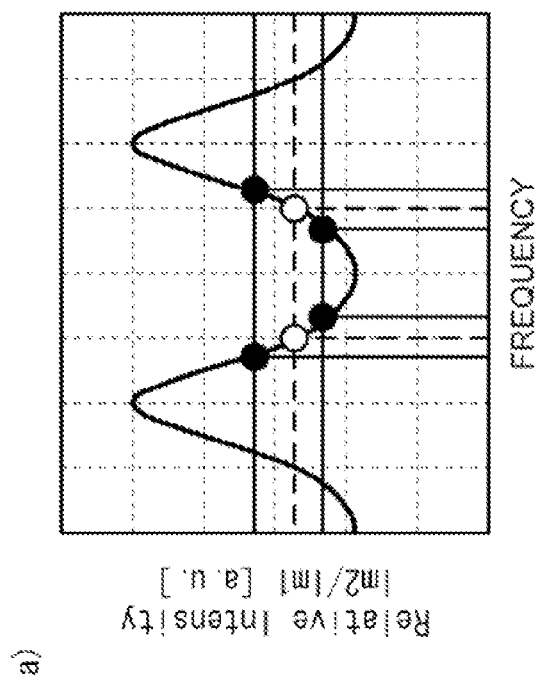

Part (a) of FIG. 11 is a drawing showing the fine tune range in the case where only the target changing method is adopted. This example is an example wherein a range for pulling into the target in the AFC control (capture range) is set to about 16% (±8%) of FSR (free spectrum region) of the transmission characteristic of the etalon 52 and the ends of the target variable range are set outside ±6% of that range. Blank dots indicate required wavelengths in the gridless control and solid dots wavelengths at the ends of the target variable range. The required wavelengths in the gridless control are set at the center of the target variable range. As shown in Part (b) of FIG. 11, when the target value at the fundamental wavelength=191.3000 THz is 0.547 and when the target variable range is set to the target values of 0.468 to 0.657, the fine tune range is only 6 GHz from 191.2970 THz to 191.3030 THz.

Part (c) of FIG. 11 is a drawing showing the fine tune range in the case where the target changing method and the etalon temperature changing method both are used together. In this case, first, the positions of the required wavelengths in the gridless control are shifted to the end of the target variable range. Therefore, in the example of Part (d) of FIG. 11, the target value at the required wavelength=191.3000 THz in the gridless control is shifted to the upper limit of 0.657. First, when the target variable range is set to the target values of 0.468 to 0.657, the available frequency range is from 191.3000 THz to 191.3060 THz. Furthermore, by changing the temperature of the etalon 52, the fine tune range can be expanded to a frequency lower than 191.3000 THz. In this way, the fine tune range can be expanded by setting the control range of target value to a range defined by the lower and upper ends of the target value variable range arranged alternately corresponding to wavelengths. The upper end has a predetermined range and this range can also be called a first range. Furthermore, the lower end also has a predetermined range and this range can also called a second range. In addition, the upper ends of the target value variable range has including a upper peak of the etalon. The lower ends of the target value variable range has including a lower peak of the etalon.

In using both of the target changing method and the etalon temperature changing method, the consumed power of the second temperature control device 53 may be taken into consideration. When the temperature of the second temperature control device 53 is controlled so as to become farther from the ambient temperature, the consumed power of the second temperature control device 53 increases. In the present Example 2, the temperature of the semiconductor laser 30 (the temperature of the first temperature control device 31) can be used as the ambient temperature around the second temperature control device 53.

In the present Example 2, when the temperature of the etalon 52 is lowered with the ratio $I_{m2}/I_{m1}$ of the feedback control target value being kept constant, the lasing frequency of the semiconductor laser 30 becomes larger in the AFC control. The semiconductor laser 30 operates at high temperature (e.g., 80° C.) and the etalon 52 is cooled by the second temperature control device 53 in order to avoid influence of the high temperature. Therefore, when the temperature of the etalon 52 is attempted to decrease (e.g., from 40° C. to 30° C.) in order to increase the lasing frequency of the semiconductor laser 30, the temperature of the second temperature control device 53 is controlled so as to become farther from the ambient temperature. As a result, the consumed power of the second temperature control device 53 increases.

In the present Example 2, therefore, the target changing method is used in carrying out the fine tuning to increase the lasing frequency, while the etalon temperature changing method is used in carrying out the fine tuning to decrease the lasing frequency. Specifically, as shown in Part (c) of FIG. 11, the position of the frequency at the fine tuning start is shifted to the lower frequency side from the center of the target variable range, the target changing method is used on the higher frequency side than the wavelength, and the etalon temperature changing method is used on the lower frequency side than the required wavelength.

In the present Example 2, the processing after step S13 in FIG. 9 is as described below. Since the temperature of the second temperature control device 53 is controlled to be lower than the ambient temperature, the power consumption of the second temperature control device 53 can be lower in the case of control to increase the temperature of the second temperature control device 53. For this reason, the etalon temperature changing method is used in carrying out the fine tuning to decrease the lasing frequency. The temperature of the etalon 52 resulting from a compensation corresponding to a change by the fine tuning, e.g., −1 GHz, for the temperature of the etalon 52 is stored as an updated set value. Specifically, the controller 70 changes the temperature of the etalon 52 in accordance with the foregoing Expression (2) so as to realize the required wavelength in the fine tuning (step S14). When it is assumed, for example, that $\Delta F2$=−1 GHz, the temperature correction coefficient C2 is −1.800 [GHz/° C.], and the set temperature Tetln_A is 50.000 [° C.], the set temperature Tetln_C is calculated to be 50.556 [° C.].

In step S13, the target changing method is used in carrying out the fine tuning to increase the lasing frequency. Specifically, the controller 70 changes the feedback control target value in accordance with the foregoing Expression (3) so as to realize the required wavelength in the fine tuning (step S15). When it is assumed, for example, that $\Delta F2$=+1 GHz, the correction coefficient B1=−31.8 [GHz], and Target_B=0.657, Target_A is calculated to be 0.626.

When the controller 70 confirms that the lasing wavelength of the semiconductor laser 30 is changed by execution of step S14 or step S15 and that the lasing wavelength is the required wavelength in the fine tuning or falls within a range with a predetermined width for the required wavelength, it again output the AFC lock flag (step S16). Thereafter, execution of the flowchart is terminated.

In the present Example 2, the etalon temperature changing method is adopted in one of increase and decrease in frequency from the frequency at the fine tuning start and the target changing method is adopted in the other. This can expand the fine tune range. For expanding the fine tune range in the target changing method, it is preferable to shift the position of the wavelength at the fine tuning start to either one side from the center of the target variable range to expand the target variable range on the one side. In using both of the target changing method and the etalon temperature changing method, it is preferable to take the consumed power of the second temperature control device 53 into consideration. Specifically, it is preferable to use the target changing method in carrying out the fine tuning to increase the lasing frequency and to use the etalon temperature changing method in carrying out the fine tuning to decrease the lasing frequency.

EXAMPLE 3

Examples 1 and 2 are described as examples of carrying out the fine tuning after the gridless control, but the fine tuning may be carried out without execution of the gridless control. In this case, by the same techniques as in Examples 1, 2, the etalon temperature changing method is adopted in one of increase and decrease in frequency from the fundamental wavelength and the target changing method is adopted in the other. This can expand the fine tune range.

What is claimed is:
1. A method for controlling a wavelength tunable laser having a wavelength detection unit including an etalon, the method comprising:
   a first step of acquiring information of a first control value to define a wavelength characteristic of the etalon in the drive condition corresponding to a first wavelength, a first target value of the wavelength detection unit corresponding to the first wavelength, a value of a second wavelength different from the first wavelength, and a value of a shift amount;
   a second step of calculating a second control value from the first control value to define a wavelength characteristic of the etalon to acquire the second wavelength when the wavelength detection unit detects the first target value;
   a third step of selecting either
   A) shifting wavelength of the laser by changing the first target value to a second target value corresponding to the shift amount, or
   B) shifting wavelength of the laser by changing the second control value of the wavelength characteristics of the etalon to a third control value of the wavelength characteristics of the etalon corresponding to the shift amount; and
   a fourth step of driving the laser by using either
   A) second control value of the wavelength characteristics of the etalon, and the second target value, or
   B) third control value of the wavelength characteristics of the etalon, and the first target value.

2. The method according to claim 1, comprising a fifth step of controlling the wavelength of the wavelength tunable laser while the wavelength characteristic of the etalon is determined based on the second control value and the first target value is determined to be the control target value of the wavelength detection result obtained by the wavelength detection unit, prior to the third step.

3. The method according to claim 1, wherein each of the control values of the wavelength characteristic of the etalon is a temperature of the etalon, and
   wherein the temperature of the etalon is controlled by a temperature control device including a Peltier device.

4. The method according to claim 3, wherein the selecting in the third step is carried out according to a sign of the shift amount acquired in the first step.

5. The method according to claim 3, wherein the third step comprises selecting either one process with a smaller consumed power of the temperature control device.

6. The method according to claim 5, wherein the selecting in the third step is carried out according to a relation between the temperature of the etalon and an ambient temperature around the etalon.

7. The method according to claim 1, wherein the first target value is generated to corresponding a plurality of target wavelengths, each target value being assigned alternately to a first range including a lower peak of the etalon and a second range including an upper peak of the etalon.

8. The method according to claim 7, wherein when receiving a demand for output of a wavelength different from the second wavelength, an operation to change the second target value is carried out according to a difference between the second wavelength and the required wavelength and the second target value is set in the variable range.

9. The method according to claim 7, wherein each of the control values of the wavelength characteristic of the etalon is a temperature of the etalon, and the temperature of the etalon is controlled by a temperature control device including a Peltier device, and wherein when the second target value changes from the first range as the first target value toward the second range, or when the second target value changes from the second range as the first target value toward the first range, a consumed power of the temperature control device does not increase.

10. A wavelength tunable laser comprising:
  an etalon having a wavelength characteristics that alternately changes an intensity of output value in accordance with continuously changing wavelength;
  a memory stores target values corresponding to a plurality of target wavelengths, each target value being assigned alternately to a first range including a lower peak of the etalon and a second range including an upper peak of the etalon; and
  a control unit for controlling a lasing wavelength by a feedback operation based on a difference between the target value and a wavelength detection result by a wavelength detection unit having the etalon,
  the control unit further controls changing wavelength in accordance with a shift amount by either,
  A) by changing the target value of the feedback operation, or
  B) by changing the wavelength characteristics of the etalon.

11. The wavelength tunable laser according to claim 10, wherein when receiving a demand for output of a wavelength different from the target wavelengths stored in the memory, the control unit selects the target wavelength, carries out an operation to change the target value depending upon a difference between the target wavelength and the required wavelength, and performs the feedback operation using the updated target value obtained by the operation.

12. The wavelength tunable laser according to claim 11, wherein the control unit also carries out an operation to change a temperature of the etalon, as well as the operation to change the target value, and performs the feedback operation depending upon the required wavelength with use of results of the operations.

13. The wavelength tunable laser according to claim 10, wherein when receiving a demand for output of a wavelength different from the target wavelengths stored in the memory, the control unit selects the target wavelength, carries out an operation to change a temperature of the etalon depending upon a difference between the target wavelength and the required wavelength, and performs the feedback operation at the etalon temperature obtained by the operation.

\* \* \* \* \*